United States Patent
Mitani et al.

[19]

[11] Patent Number: 5,847,985
[45] Date of Patent: Dec. 8, 1998

[54] MEMORY MODULES

[75] Inventors: Hidenori Mitani, Tokyo; Masanori Nagahama, Sanda, both of Japan

[73] Assignee: Mitsubishi Denki Kabushiki Kaisha, Tokyo, Japan

[21] Appl. No.: 923,520

[22] Filed: Sep. 4, 1997

[30] Foreign Application Priority Data

Mar. 24, 1997 [JP] Japan ..................................... 9-069688

[51] Int. Cl.⁶ ................................................. G11C 11/34
[52] U.S. Cl. ................. 365/63; 365/230.06; 365/230.03; 361/686; 361/760; 361/777; 361/790
[58] Field of Search ................................. 365/63, 230.03, 365/230.06; 361/686, 760, 777, 790

[56] References Cited

U.S. PATENT DOCUMENTS 5,295,255  3/1994  Malecek et al. .
5,319,602  6/1994  Shishikura .
5,701,031  12/1997 Oguchi et al. ............................ 257/686
5,708,298  1/1998  Masayuki et al. ....................... 257/723
5,737,563  4/1998  Shigeeda ................................. 395/405

FOREIGN PATENT DOCUMENTS 62-195199  8/1987  Japan .
5-47181    2/1993  Japan .

Primary Examiner—Viet Q. Nguyen
Attorney, Agent, or Firm—McDermott, Will & Emery

[57] ABSTRACT

A memory module comprising a plurality of identical wiring boards stacked in a multi-stage fashion provides with only one decoder mounted on one of the plurality of identical wiring boards and a plurality of inter-pattern connection means arranged on the wiring boards each for selectively connecting a first wiring pattern connected to said output of said decoder and a second wiring pattern connected to said at least one IC memory chip on each wiring board.

7 Claims, 15 Drawing Sheets

MEMORY MODULES

BACKGROUND OF THE INVENTION

1. Field of the Invention

The present invention relates to memory modules and more particularly a memory module formed of a plurality of wiring boards on which IC memory chips are mounted.

2. Description of the Related Art

FIG. 15 is an oblique sketch of an example of prior memory modules. Referring to FIG. 15, a memory module 200 comprises a wiring board 203 on which a memory 201 that consists in at least one IC memory chip and a decoder 202 that decodes an address signal are mounted, a wiring board 206 on which a memory 204 that consists in at least one IC memory chip and a decoder 205 that decodes an address signal are mounted, and a wiring board 209 on which a memory 207 that consists in at least one IC memory chip and a decoder 208 that decodes an address signal are mounted. The three boards are connected together by clip leads 210 so that memory module 200 should be formed of superimposed several layers.

FIG. 16 is a block diagram illustrating the connections between memories 201, 204, 207 and decoders 202, 205, 208. Referring to FIG. 16, each of the memories 201, 204, 209 comprises n IC memory chips, where n is a natural number. Each IC memory chip IA1, . . . , IAn is connected to decoder 202 respectively through a corresponding signal line a1, . . . , an. Each IC memory chip IB1, . . . , IBn of memory 204 is connected to decoder 205 respectively through a corresponding signal line b1, . . . , bn. Each IC memory chip IC1, . . . , ICn of memory 207 is connected to decoder 208 respectively through a corresponding signal line c1, . . . , cn.

Further, each IC memory chip forming memories 201, 204, 207 is connected to an address bus 211, a data bus 212, and an control signal line 213 through clip leads 210. Also, decoders 202, 205, 208 are connected to address bus 211. Address bus 211, data bus 212, and control signal line 213 are connected to a host system apparatus 214 consisting in information processing equipment. Clip leads 210 serve both as connections between wiring boards 203, 206, and 209 and as lead wires for connections to host system apparatus 214.

For example, an m-bit data word indicating one of 1, . . . , n for the above n is in the first to mth bits of an address signal and input to decoder 202. The next (m+1)th to 2mth bits of the address signal indicating one of 1, n is input to decoder 205. The next (2m+1)th to 3mth bits of the address signal indicating one of 1, . . . , n is input to decoder 208. For example, if n is 4, then 2 bits are required to express one of 1, . . . , n in the binary expression, so that m is 2. Each of the decoders 202, 205, 208 generates a chip-select signal from the input signal to output into the IC memory chip that the address signal indicates. For example, if the input signal indicates the IC memory chip IA1 of memory 201, the decoder 202 outputs a chip-select signal only into IC memory chip IA1.

However, In the above construction, in order to select each of the IC memory chips that constitute each memory 201, 204, 207, a decoder must be mounted on each wiring board 203, 206, 209. Further, the address signal lines must be wired to decoders 202, 205, 208 differently, so that different wiring boards having different wiring patterns are required for each memory module. Therefore, each wiring board 203, 206, 209 is designed and manufactured differently, causing low efficiency and high costs. Further, clip leads 210 are formed depending on the number of wiring boards, so that the number of wiring boards cannot be increased to expand memory size, after a memory module is completed.

Therefore, memory modules in which a single decoder selects a memory chip from the memory chips mounted on a plurality of boards have been disclosed in Japanese Pats. Kai Sho62-195199, Kai Hei5-47181, and US Pat. No. 5,295, 255 and others. However, their constructions are different from the memory modules of the present invention.

SUMMARY OF THE INVENTION

The object of the present invention is therefore to solve the above problems and to obtain a memory module formed of superimposed several wiring boards such that all the wiring boards are identical and memory expansion can be easily made.

In order to achieve the aforementioned objective, according to the present invention, there is provided a memory module comprising a plurality of identical wiring boards each having a wiring pattern formed thereon and at least one IC memory chip mounted thereon; board connection means which supports the plurality of wiring boards in a multi-stage fashion and electrically connects respective wiring boards; one decoder mounted on one of the plurality of wiring boards which decoded address signals externally input and outputs control signals; each of the wiring patterns comprising a first wiring pattern being connected to the output of the decoder and a second wiring pattern being connected to the at least one IC chip mounted on the each wiring board; and inter-pattern connection means arranged on each wiring board for selectively connecting the first wiring pattern and the second wiring pattern.

According to a first aspect of the present invention, each of the above inter-pattern connection means comprises pads that are formed on each of the wiring boards and lead wires that connect predetermined ones of the pads together. The pads are formed either as wiring patterns connected to the decoder or as wiring patterns connected to the IC memory chips.

According to a second aspect of the present invention, each of the inter-pattern connection means comprises pads that are formed on each of the wiring boards and chip jumpers that connect predetermined ones of the pads together. The pads are formed either as wiring patterns connected to the decoder or as wiring patterns connected to the IC memory chips.

According to a third aspect of the present invention, each of the inter-pattern connection means is a switch mounted on each of the wiring boards and establishes connections between the first and second wiring patterns connected to the decoder and the wiring patterns connected to the IC memory chips to allow a control signal output from the decoder to be input to a corresponding IC memory chip.

According to a fourth aspect of the present invention, the above board connection means consist in a plurality of clip leads that also establish connections between the decoder and the first wiring pattern on each of the wiring boards on which the decoder is not mounted.

According to a fifth aspect of the present invention, the board connection means consists of a plurality of sockets that superimpose the wiring boards to form several layers and connect the wiring boards together, by connecting the sockets installed on the same locations of each of the wiring boards. The sockets also establish connections between the decoder and the first wiring pattern on each of the wiring boards on which the decoder is not mounted.

According to a sixth aspect of the present invention, the memory module has through holes formed in the same locations of each of the wiring boards, pads formed around the through holes to be connected to predetermined wiring patterns, and lead wires passed through the through holes formed in identical locations of the wiring boards and electrically connected to the corresponding pads to establish connections between the decoder and the first wiring pattern on each of the wiring boards on which the decoder is not mounted.

BRIEF DESCRIPTION OF THE DRAWINGS

These and other objects and features of the present invention will become clear from the following description taken in conjunction with the preferred embodiments thereof and the accompanying drawings throughout which like parts are designated by like reference numerals, and in which.

DETAILED DESCRIPTION OF THE PREFERRED EMBODIMENTS

The preferred embodiments according to the present invention will be described below in conjunction with the attached drawings.

FIRST EMBODIMENT

Figure 1:
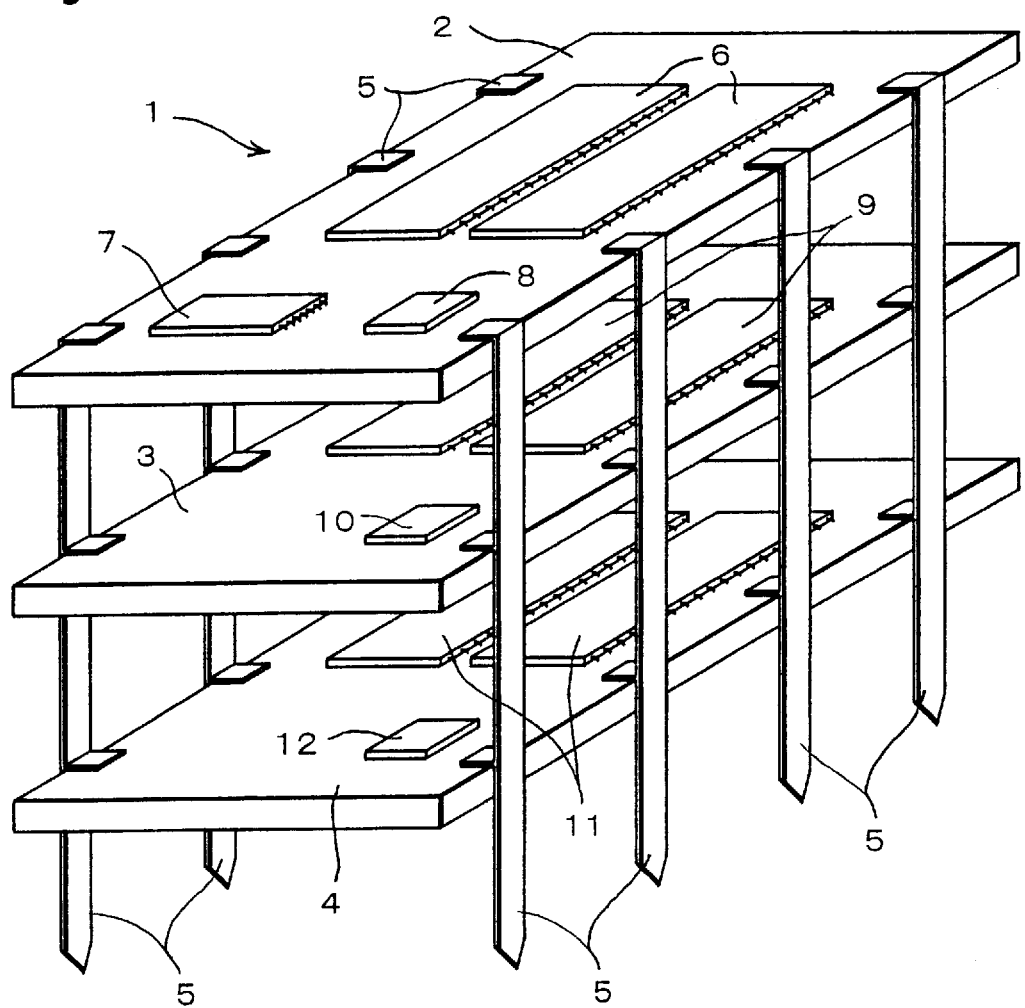
FIG. 1 is an oblique sketch illustrating an example of memory modules in a first embodiment of the present invention.

FIG. 1 is an oblique sketch illustrating an example of memory modules in a first embodiment of the present invention. Referring to FIG. 1, a memory module 1 comprises three identical wiring boards 2, 3, 4 connected by a plurality of clip leads 5 so as to form superimposed several layers. A memory 6 that consist in a plurality of IC memory chips and a decoder 7 that decodes an address signal to generate a chip-select signal are mounted on wiring board 2. On wiring board 2 is also formed a switching section 8 that allows a chip-select signal for the IC memory chips of memory 6 output from decoder 7 to be input to memory 6.

Further, a memory 9 consisting in a plurality of IC memory chips is mounted on wiring board 3. On wiring board 3 is also formed a switching section 10 that allows a chip-select signal for the IC memory chips of memory 9 output from decoder 7 to be input to memory 9. Similarly, a memory 11 consisting in a plurality of IC memory chips is mounted on wiring board 4. On wiring board 4 is also formed a switching section 12 that allows a chip-select signal for the IC memory chips of memory 11 output from decoder 7 to be input to memory 11. Here, in FIG. 1, part of the clip leads 5 is omitted.

Figure 2:
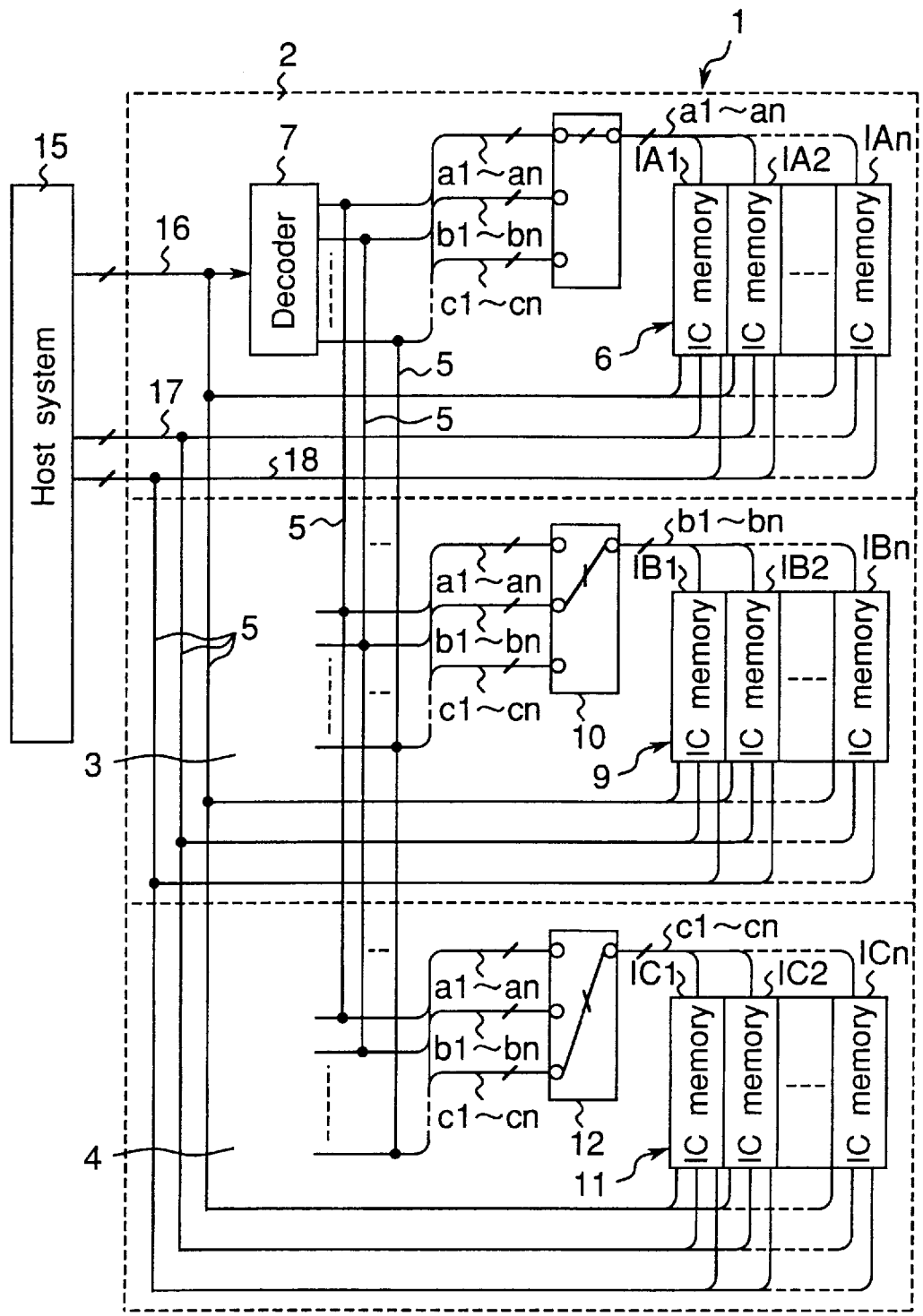
FIG. 2 is a block diagram illustrating an example of the connections between memories 6, 9, 11 and decoder 7 shown in FIG. 1.

FIG. 2 is a block diagram illustrating an example of the connections between memories 6, 9, 11 and decoder 7 shown in FIG. 1. Referring to FIG. 2, each of the memories 6, 9, 11 comprises n IC memory chips. The IC memory chips IA1, . . . , IAn of memory 6 are connected to decoder 7 respectively through corresponding signal lines a1, . . . an and through switching section 8. The IC memory chips IB1, IBn of memory 9 are connected to decoder 7 respectively through corresponding signal lines b1, . . . bn and through switching section 10 and clip leads 5. Similarly, the IC memory chips IC1, . . . , ICn of memory 11 are connected to decoder 7 through corresponding signal lines c1, . . . cn and through switching section 12 and clip leads 5.

More specifically, the signal lines a1, . . . , an, b1, . . . , bn, c1, . . . , cn that are connected to decoder 7 are connected to switching section 8 and connected to switching sections 10, 12 through clip leads 5. Then, signal lines a1, . . . , an are connected to corresponding IC memory chips IA1, . . . , IAn through switching section 8. Signal lines b1, . . . , bn are connected to corresponding IC memory chips IB1, . . . , IBn through switching section 10. Signal lines c1, . . . , cn are connected to corresponding IC memory chips IC1, . . . , ICn through switching section 12. By these means, wiring boards 2, 3, 4 can be made identical. However, decoder 7 is not mounted on wiring boards 3 and 4.

Further, decoder 7 and memories 6, 9, 11 are connected to a host system apparatus 15 consisting in information processing equipment through clip leads 5 and an address bus 16. Also, memories 6, 9, 11 are connected to host system apparatus 15 through clip leads 5, a data bus 17, and a plurality of control signal lines 18.

In the above construction, each of the memories 6, 9, 11 receives control signals, such as a write-enable signal and an output-enable signal, from host system apparatus 15 through control signal lines 18. Decoder 7 receives an address signal from host system apparatus 15 through address bus 16. When receiving the address signal, decoder 7 generates a chip-select signal for selecting one of the IC memory chips IA1, . . . , IAn, IB1, . . . , IBn, IC1, . . . , ICn to output the chip-select signal into the corresponding signal line of a1, . . . , an, b1, . . . , bn, c1, . . . , cn connected to the selected IC memory chip.

Figure 3:
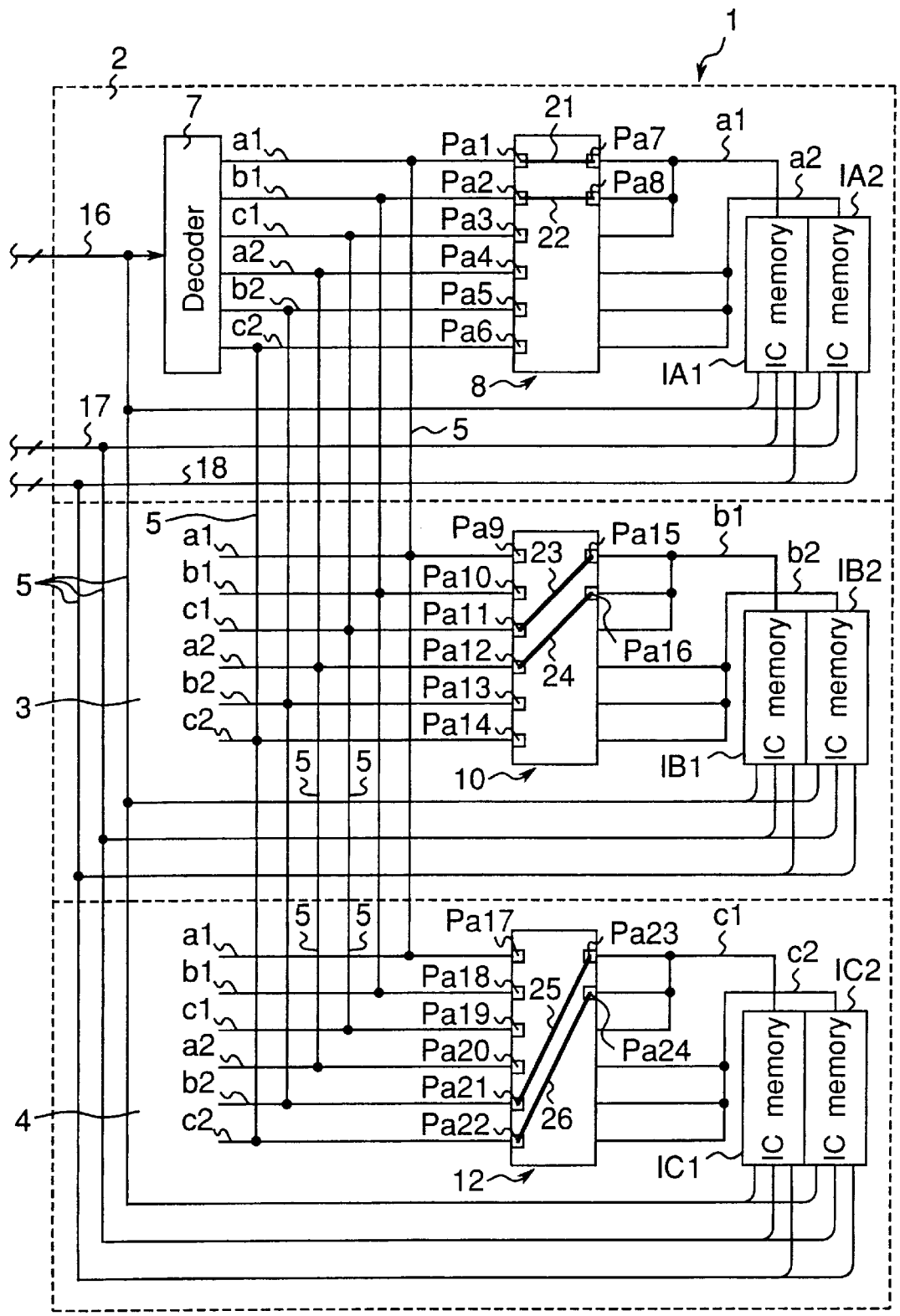
FIG. 3 is a block diagram illustrating exemplary constructions of switching sections 8, 10, 12 in FIG. 1.

Next, switching sections 8, 10, 12 are described. FIG. 3 is a block diagram illustrating exemplary constructions of switching sections 8, 10, 12 in FIG. 1. In FIG. 3, the memory 6 of FIG. 2 consists of IC memory chips IA1 and IA2; memory 9 consists of IC memory chips IB1 and IB2; memory 11 consists of IC memory chips IC1 and IC2.

Referring to FIG. 3, the signal lines a1, a2, b1, b2, c1, c2 that are connected to decoder 7 are connected to corresponding pads pa1, . . . , Pa6 of switching section 8 through wiring patterns on wiring board 2. These signal lines are also connected to corresponding pads pa9, . . . , Pa14 of switching section 10 through clip leads 5 and wiring patterns on wiring board 3, and also connected to corresponding pads pa17, . . . , Pa22 of switching section 12 through clip leads 5 and wiring patterns on wiring board 4.

Further, IC memory chip IA1 is connected to the pad Pa7 of switching section 8 through a wiring pattern on wiring board 2; IC memory chip IA2 is connected to the pad Pa8 of switching section 8 through a wiring pattern on wiring board 2. Similarly, IC memory chip IB1 is connected to the pad Pa15 of switching section 10 through a wiring pattern on wiring board 3; IC memory chip IB2 is connected to the pad Pa16 of switching section 10 through a wiring pattern on wiring board 3. IC memory chip IC1 is connected to the pad Pa23 of switching section 12 through a wiring pattern on wiring board 4; IC memory chip IC2 is connected to the pad Pa24 of switching section 12 through a wiring pattern on wiring board 4.

The pads Pa1, . . . , Pa8 of switching section 8 are formed on wiring board 2. Similarly, the pads Pa9, . . . , Pa16 of switching section 10 are formed on wiring board 3. The pads Pa17, . . . , Pa24 of switching section 10 are formed on wiring board 4. Here, the wiring patterns of wiring boards 2, 3, 4 are identical, so that the pads Pa1, . . . , Pa8 on wiring board 2, the pads Pa9, . . . , Pa16 on wiring board 3, and the pads Pa17, . . . , Pa24 on wiring board 4 are the same.

In switching section 8, the pads Pa1 and Pa7 are connected to each other through a lead wire 21 by soldering so that the signal line a1 should be connected to IC memory chip IA1; the pads Pa2 and Pa8 are connected to each other through a lead wire 22 by soldering so that the signal line a2 should be connected to IC memory chip IA2. In switching section 10, the pads Pa11 and Pa15 are connected to each other through a lead wire 23 by soldering so that the signal line b1 should be connected to IC memory chip IB1; the pads Pa12 and Pa16 are connected to each other through a lead wire 24 by soldering so that the signal line b2 should be connected to IC memory chip IB2. In switching section 12, the pads Pa21 and Pa23 are connected to each other through a lead wire 25 by soldering so that the signal line c1 should be connected to IC memory chip IC1; the pads Pa22 and Pa24 are connected to each other through a lead wire 26 by soldering so that the signal line c2 should be connected to IC memory chip IC2.

In this way, switching section 8 comprises pads Pa1, . . . , Pa8 formed on wiring board 2 and lead wires 21, 22. Switching section 10 comprises pads Pa9, . . . , Pa16 formed on wiring board 3 and lead wires 23, 24. Switching section 12 comprises pads Pa17, . . . , Pa24 formed on wiring board 4 and lead wires 25, 26. Decoder 7 generates from the input address signal a chip-select signal for selecting one of the IC memory chips IA1, IA2, IB1, IB2, IC1, IC2 to output the chip-select signal into the corresponding signal line of a1, a2, b1, b2, c1, c2 connected to the selected IC memory chip. By these means, IC memory IA1, IA2, IB1, IB2, IC1, IC2 can be used as a continuous memory area.

Clip leads 5 are connected to wiring boards 2, 3, 4, so that part of the clip leads 5 that becomes NC (NO CONNECTION) pins unused for electric connections can be used for connections between decoder 7 and switching sections 10, 12 for ease of wiring.

If part of the clip leads 5 that becomes NC pins does not exist, then pads are formed at the same locations of an edge of each wiring board 2, 3, 4, and clip leads 28 can be used to connect decode 7 to switching sections 10, 12 through the pads.

Figure 4:
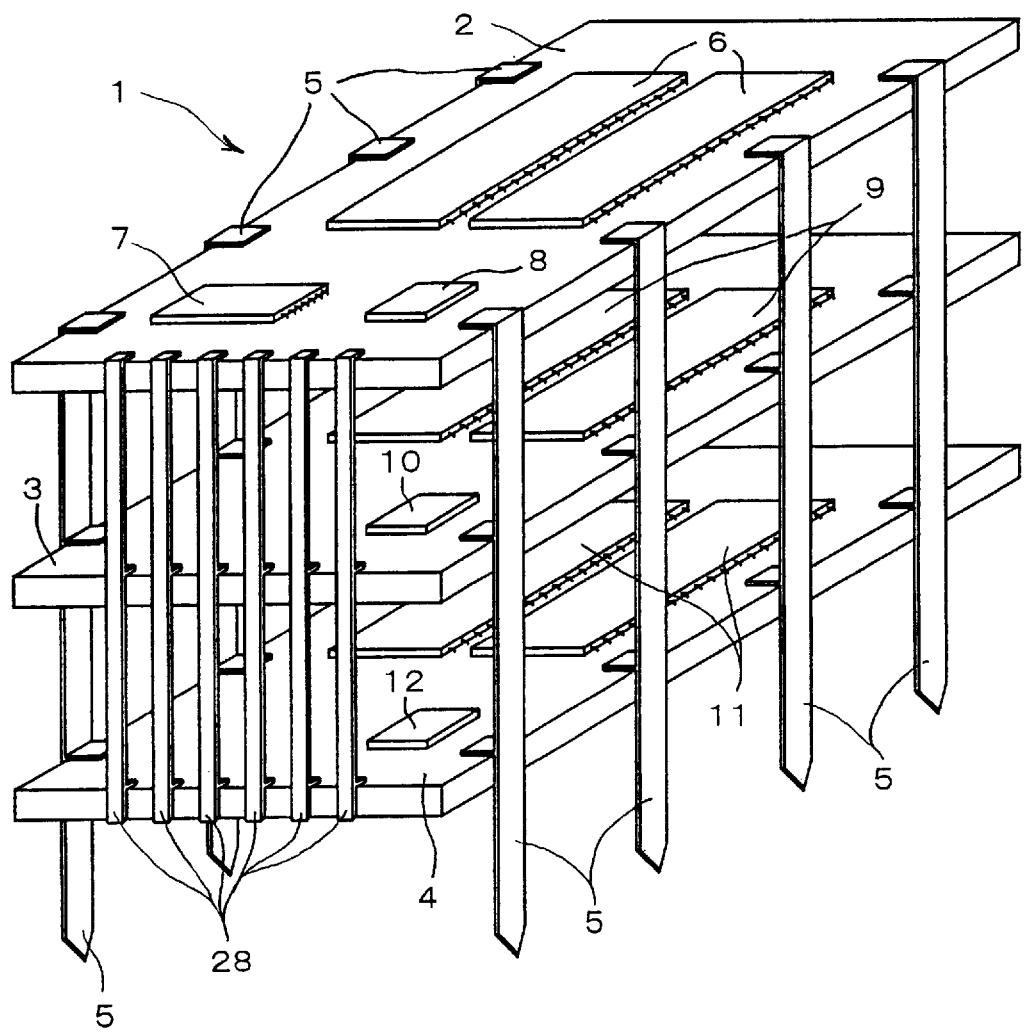
FIG. 4 is an oblique sketch illustrating another example of memory modules in the first embodiment of the present invention.

FIG. 4 is an oblique sketch illustrating an example of memory modules that use clip leads 28. In FIG. 4, all of the clip leads 28 are not shown, and only part of the clip leads 28 is shown.

Referring to FIG. 4, pads are formed at the same locations of an edge of each wiring board 2, 3, 4 corresponding to signal lines a1, . . . , an, b1, . . . , bn, c1, . . . , cn. Then the pads formed at the same location of each wiring board 2, 3, 4 are connected to each other through clip leads 28. Here, clip leads 5 do not only connect each wiring board 2, 3, 4 to each other but also serve as cable terminals. However, clip leads 28 do not serve as cable terminals but are used only for connecting each wiring board 2, 3, 4 to each other. The connections of clip leads 28 to wiring boards 2, 3, 4 are the same as of clip leads 28.

If neither part of the clip leads 5 that becomes NC pins nor space at an edge of the wiring boards for forming pads exists, then lead wires having insulating films can be used for the connections in place of clip leads 28.

As described above, the memory module in the first embodiment of the present embodiment is constructed by connecting three wiring boards 2, 3, 4 with clip leads 5 to form superimposed several layers. Then a connection between decoder 7 and each IC memory chip of memories 6, 9, 11 can be established with lead wires by changing the connections of switching sections 8, 10, 12 formed on wiring boards 2, 3, 4. Therefore, wiring boards 2, 3, 4 can be made identical, so that developing and manufacturing costs of the wiring boards can be reduced. Further, the number of decoders can be made one. Therefore, costs of memory modules can be reduced.

SECOND EMBODIMENT

In the above first embodiment, the connections between pads in each switching section are made by soldering lead wires with hands. However, chip jumpers having resistance 0 can be used in place of lead wires. A memory module constructed in this way is a second embodiment of the present invention.

Figure 5:
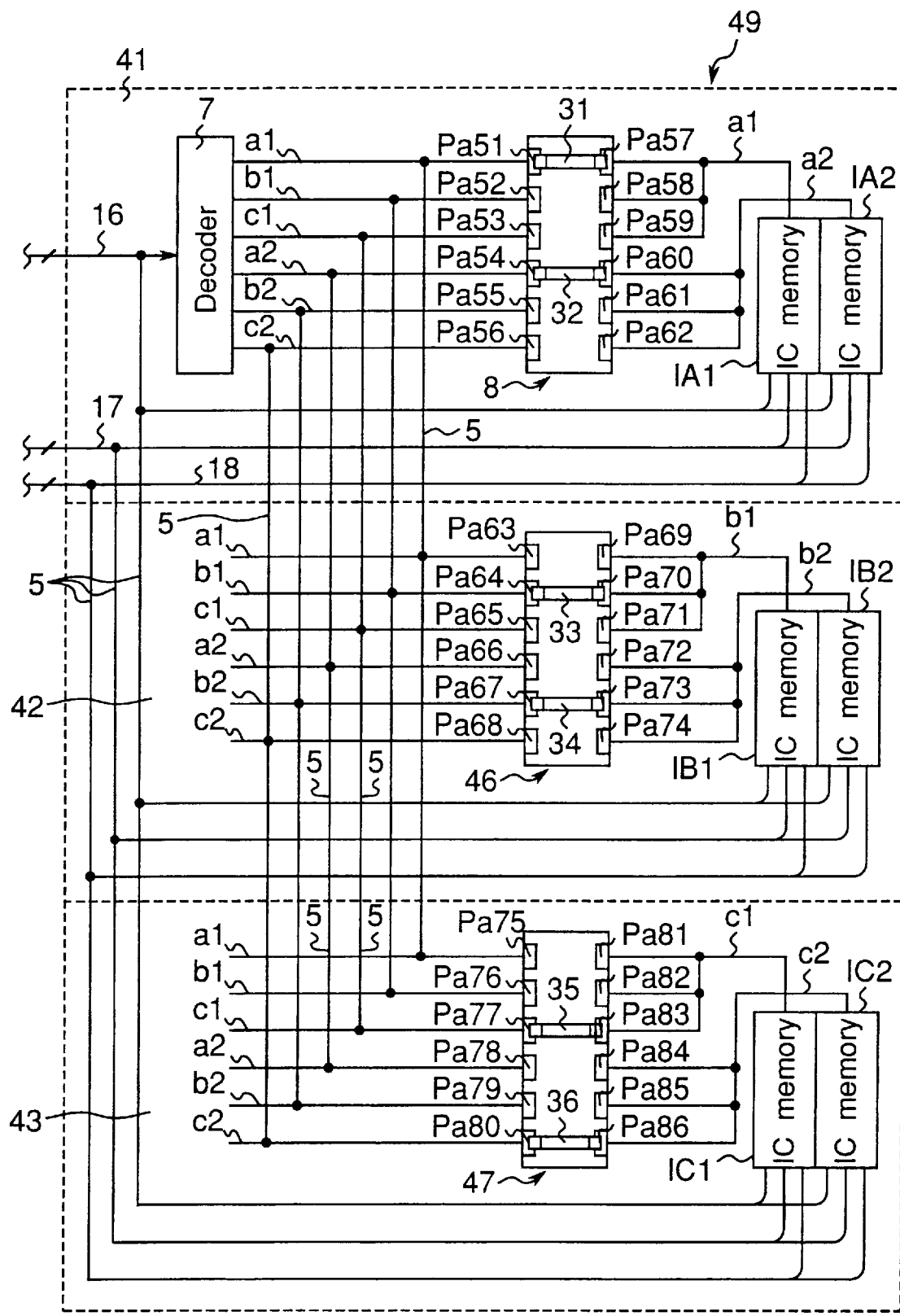
FIG. 5 is a block diagram illustrating exemplary constructions of switching sections used for memory modules in a second embodiment of the present invention.

FIG. 5 is a block diagram illustrating exemplary constructions of switching sections used for memory modules in a second embodiment of the present invention. In FIG. 5, the same components as in FIG. 3 are indicated with the same numerals, and their descriptions are omitted from here. Only those different from FIG. 3 are described in the following. In FIG. 5 as in FIG. 3, memory 6 consists of IC memory chips IA1 and IA2; memory 9 consists of IC memory chips IB1 and IB2; memory 11 consists of IC memory chips IC1 and IC2.

FIG. 5 differs from FIG. 3 as follows. Chip jumpers 31, . . . , 36 are used in place of the lead wires 21, . . . , 26 of switching sections 8, 10, 12 in FIG. 3. The number and locations of pads at each switching section are changed with this modification. Therefore, the wiring board 2 of FIG. 3 is changed into a wiring board 41; the wiring board 3 of FIG. 3 is changed into a wiring board 42; the wiring board 4 of FIG. 3 is changed into a wiring board 43. The switching section 8 of FIG. 3 is changed into a switching section 45; the switching section 10 of FIG. 3 is changed into a switching section 46; the switching section 12 of FIG. 3 is changed into a switching section 47. The memory module 1 is now changed into a memory module 49.

An oblique sketch illustrating an example of memory modules in the second embodiment of the present invention is the same as FIG. 1 except the numerals denoting the memory module and switching sections. A block diagram illustrating an example of the connections between the memories and the decoder is the same as FIG. 2 except the numerals denoting the memory module and switching sections. Therefore, these figures are omitted from here.

Referring to FIG. 5, memory module 49 is formed of three identical wiring boards 41, 42, 43. On wiring board 41, IC memory chips IA1, IA2 and decoder 7 are mounted. On wiring board 41 is also formed a switching section 45 that allows the chip-select signal for IC memory chips IA1, IA2 to be input to corresponding IC memory chips IA1 or IA2. On wiring board 42, IC memory chips IB1, IB2 are mounted. On wiring board 42 is also formed a switching section 46 that allows the chip-select signal for IC memory chips IB1, IB2 to be input to corresponding IC memory chips IB1 or IB2. Similarly, On wiring board 43, IC memory chips IC1, IC2 are mounted. On wiring board 43 is also formed a switching section 47 that allows the chip-select signal for IC memory chips IC1, IC2 to be input to corresponding IC memory chips IC1 or IC2. Decoder 7 is not mounted on wiring boards 42, 43.

The signal lines a1, b1, c1, a2, b2, c2 that are connected to decoder 7 are connected to corresponding pads Pa51, ..., Pa56 of switching section 45 through wiring patterns on wiring board 41. These signal lines are also connected to corresponding pads Pa63, ..., Pa68 of switching section 46 through clip leads 5 and wiring patterns on wiring board 42, and also connected to corresponding pads Pa75, ..., Pa80 of switching section 47 through clip leads 5 and wiring patterns on wiring board 43. Further, pads Pa57, ..., Pa62 are formed at switching section 45 opposite to pads Pa51, ..., Pa56. Similarly, pads Pa69, ..., Pa74 are formed at switching section 46 opposite to pads Pa63, ..., Pa68. Pads Pa81, ..., Pa86 are formed at switching section 47 opposite to pads pa75, ..., Pa80.

Specifically, the signal line a1 is connected to pads Pa51, Pa63, Pa75. The signal line b1 is connected to pads Pa52, Pa64, Pa76. The signal line c1 is connected to pads Pa53, Pa65, Pa77. The signal line a2 is connected to pads Pa54, Pa66, Pa78. The signal line b2 is connected to pads Pa55, Pa67, Pa79. The signal line c2 is connected to pads Pa56, Pa68, Pa80.

Further, pads Pa57, Pa58, Pa59 are connected to each other by a wiring pattern on wiring board 41. Pads Pa60, Pa61, Pa62 are connected to each other by a wiring pattern on wiring board 41. Similarly, pads Pa69, Pa70, Pa71 are connected to each other by a wiring pattern on wiring board 42. Pads Pa72, Pa73, Pa74 are connected to each other by a wiring pattern on wiring board 42. Pads Pa81, Pa82, Pa83 are connected to each other by a wiring pattern on wiring board 43. Pads Pa84, Pa85, Pa86 are connected to each other by a wiring pattern on wiring board 43.

IC memory chip IA1 is connected to the pads Pa57, Pa58, Pa59 of switching section 45 through a wiring pattern on wiring board 41; IC memory chip IA2 is connected to the pads Pa60, Pa61, Pa62 of switching section 45 through a wiring pattern on wiring board 41. Similarly, IC memory chip IB1 is connected to the pads Pa69, Pa70, Pa71 of switching section 46 through a wiring pattern on wiring board 42; IC memory chip IB2 is connected to the pads Pa72, Pa73, Pa74 of switching section 46 through a wiring pattern on wiring board 42. IC memory chip IC1 is connected to the pads Pa81, Pa82, Pa83 of switching section 47 through a wiring pattern on wiring board 43; IC memory chip IC2 is connected to the pads Pa84, Pa85, Pa86 of switching section 47 through a wiring pattern on wiring board 43.

The pads Pa51, ..., Pa62 of switching section 45 are formed on wiring board 41. Similarly, the pads Pa63, Pa74 of switching section 46 are formed on wiring board 42. The pads Pa75, ..., Pa86 of switching section 47 are formed on wiring board 43. Here, the wiring patterns on wiring boards 41, 42, 43 are identical, so that the pads Pa51, ..., Pa62 on wiring board 41, the pads Pa63, Pa74 on wiring board 42, and the pads Pa75, ..., Pa86 on wiring board 43 are the same.

In switching section 45, pads Pa51 and Pa57 are connected to each other through a chip jumper 31 so that the signal line a1 should be connected to IC memory chip IA1; pads Pa54 and Pa60 are connected to each other through a chip jumper 32 so that the signal line a2 should be connected to IC memory chip IA2. In switching section 46, pads Pa64 and Pa70 are connected to each other through a chip jumper 33 so that the signal line b1 should be connected to IC memory chip IB1; pads Pa67 and Pa73 are connected to each other through a chip jumper 34 so that the signal line b2 should be connected to IC memory chip IB2. In switching section 47, pads Pa77 and Pa83 are connected to each other through a chip jumper 35 so that the signal line c1 should be connected to IC memory chip IC1; pads Pa80 and Pa86 are connected to each other through a chip jumper 36 so that the signal line c2 should be connected to IC memory chip IC2.

Chip jumpers 31, ..., 36 are automatically set at predetermined places on wiring boards 41, 42, 43 by means of automatic parts installer (Chip presser). The soldering of chip jumpers to the pads is also automatically made.

In this way, switching section 45 comprises pads Pa51, ..., Pa62 formed on wiring board 41 and chip jumpers 31, 32. Switching section 46 comprises pads Pa63, Pa74 formed on wiring board 42 and chip jumpers 33, 34. Switching section 47 comprises pads Pa75, ..., Pa86 formed on wiring board 43 and chip jumpers 35, 36.

As described above, a memory module in the second embodiment of the present invention uses chip jumpers in place of lead wires of the memory module in the first embodiment, so that the connections between pads at each switching section can be automatically made. Therefore, in addition to the advantages of the first embodiment, wiring at switching sections can be efficiently made, and manufacturing costs can be reduced. Further, the area of each switching section can be made smaller, so that the size of the wiring boards can be reduced, and costs can be reduced.

THIRD EMBODIMENT

In the above first and second embodiments, wiring at the switching section on each wiring board is made by soldering lead wires or chip jumpers. However, each switching section can be formed as a mechanical switch. Memory modules constructed in this way are a third embodiment of the present invention.

Figure 6:
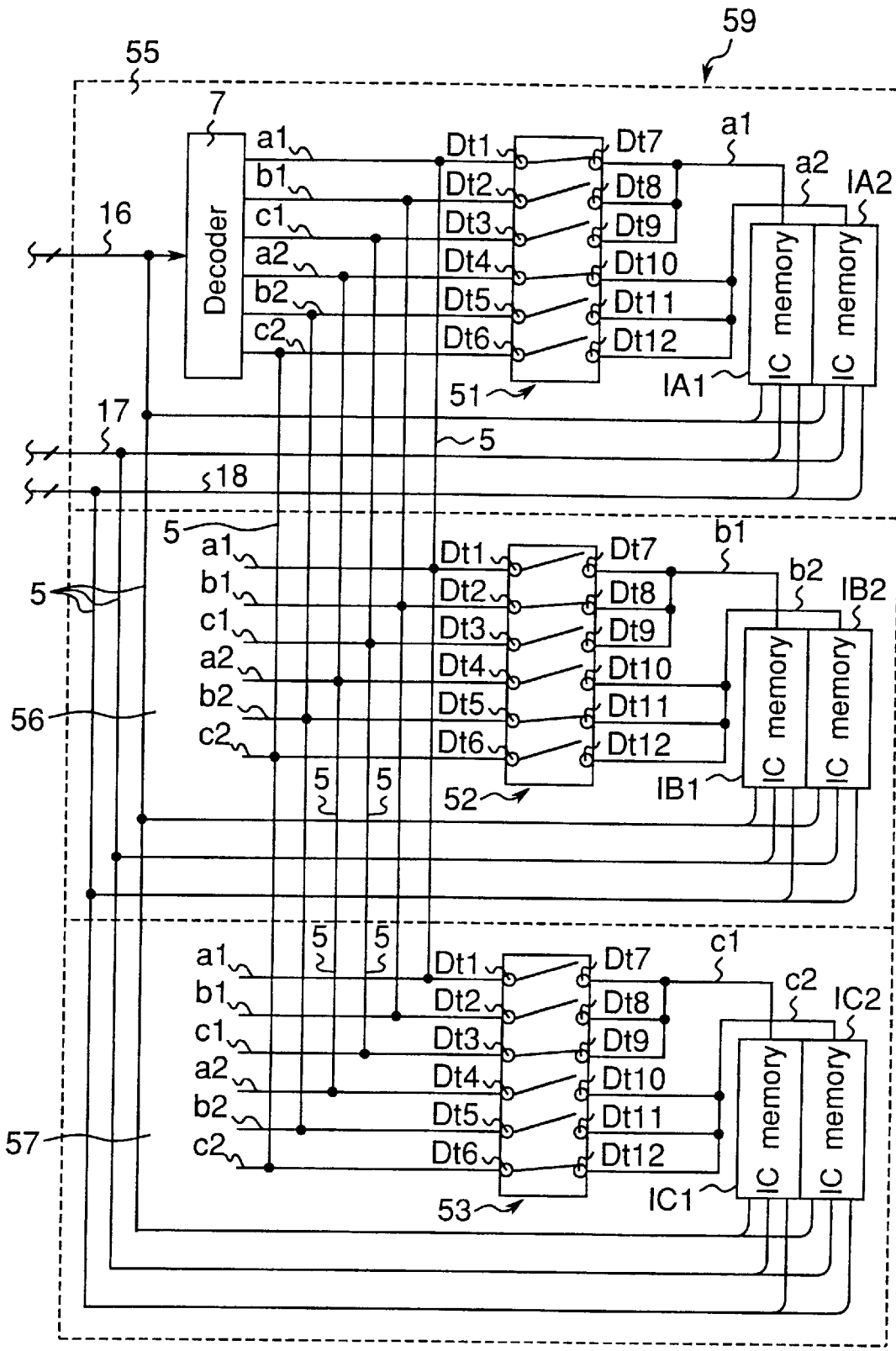
FIG. 6 is a block diagram illustrating an example of memory modules in a third embodiment of the present invention.

FIG. 6 is a block diagram illustrating an example of memory modules in the third embodiment of the present invention. In FIG. 6, the same components as in FIG. 3 are indicated with the same numerals, and their descriptions are omitted from here. Only those different from FIG. 3 are described in the following. In FIG. 6 as in FIG. 3, memory 6 consists of IC memory chips IA1 and IA2; memory 9 consists of IC memory chips IB1 and IB2; memory 11 consists of IC memory chips IC1 and IC2.

FIG. 6 differs from FIG. 3 as follows. DIP switches 51, 52, 53 are used in place of the switching sections 8, 10, 12. With these changes, the wiring board 2 of FIG. 3 is changed into a wiring board 55; the wiring board 3 of FIG. 3 is changed into a wiring board 56; the wiring board 4 of FIG. 3 is changed into a wiring board 57. The memory module 1 is now changed into a memory module 59. Each of the DIP switches 51, 52, 53 functions as a switching section.

An oblique sketch illustrating an example of memory modules in the third embodiment of the present invention is the same as FIG. 1 except the numerals denoting the memory module and the DIP switches replaced with the switching sections. A block diagram illustrating an example of the connections between the memories and the decoder is the same as FIG. 2 except the numerals denoting the memory module and the DIP switches replaced with the switching sections. Therefore, these figures are omitted from here.

Referring to FIG. 6, memory module 59 is formed of three identical wiring boards 55, 56, 57. On wiring board 55, IC memory chips IA1, IA2, decoder 7, and a DIP switch 51 are mounted. On wiring board 56, IC memory chips IB1, IB2 and DIP switch 52 are mounted. Similarly, on wiring board 57, IC memory chips IC1, IC2 and DIP switch 53 are mounted. Decoder 7 is not mounted on wiring boards 56, 57.

DIP switch 51 allows the chip-select signal for IC memory chips IA1, IA2 to be input to corresponding IC memory chips IA1 or IA2. DIP switch 52 allows the chip-select signal for IC memory chips IB1, IB2 to be input to corresponding IC memory chips IB1 or IB2. DIP switch 53 allows the chip-select signal for IC memory chips IC1, IC2 to be input to corresponding IC memory chips IC1 or IC2. DIP switches 51, 52, 53 are identical 6-circuit DIP switches having terminals Dt1, . . . , Dt6 and terminals Dt7, . . . , Dt12 placed opposite thereto. Each of the terminal pairs Dt1 and Dt7, Dt2 and Dt8, Dt3 and Dt9, Dt4 and Dt10, Dt5 and Dt11, Dt6 and Dt12 forms a single switch.

The signal lines a1, b1, c1, a2, b2, c2 that are connected to decoder 7 are connected to corresponding terminals Dt1, . . . , Dt6 of DIP switch 51 through wiring patterns on wiring board 55. These signal lines are also connected to corresponding terminals Dt1, . . . , Dt6 of DIP switch 52 through clip leads 5 and wiring patterns on wiring board 56, and also connected to corresponding terminals Dt1, . . . , Dt6 of DIP switch 53 through clip leads 5 and wiring patterns on wiring board 57.

Specifically, the signal line a1 is connected to terminal Dt1 of DIP switches 51, 52, 53. The signal line b1 is connected to terminal Dt2 of DIP switches 51, 52, 53. The signal line c1 is connected to terminal Dt3 of DIP switches 51, 52, 53. The signal line a2 is connected to terminal Dt4 of DIP switches 51, 52, 53. The signal line b2 is connected to terminal Dt5 of DIP switches 51, 52, 53. The signal line c2 is connected to terminal Dt6 of DIP switches 51, 52, 53.

Further terminals Dt7, Dt8, Dt9 of DIP switch 51 are connected to each other by a wiring pattern on wiring board 55. Terminals Dt10, Dt11, Dt12 of DIP switch 51 are connected to each other by a wiring pattern on wiring board 55. Similarly, terminals Dt7, Dt8, Dt9 of DIP switch 52 are connected to each other by a wiring pattern on wiring board 56. Terminals Dt10, Dt11, Dt12 of DIP switch 52 are connected to each other by a wiring pattern on wiring board 56. Terminals Dt7, Dt8, Dt9 of DIP switch 53 are connected to each other by a wiring pattern on wiring board 57. Terminals Dt10, Dt11, Dt12 of DIP switch 53 are connected to each other by a wiring pattern on wiring board 57.

IC memory chip IA1 is connected to the terminals Dt7, Dt8, Dt9 of DIP switch 51 through a wiring pattern on wiring board 55; IC memory chip IA2 is connected to the terminals Dt10, Dt11, Dt12 of DIP switch 51 through a wiring pattern on wiring board 55. Similarly, IC memory chip IB1 is connected to the terminals Dt7, Dt8, Dt9 of DIP switch 52 through a wiring pattern on wiring board 56; IC memory chip IB2 is connected to the terminals Dt10, Dt11, Dt12 of DIP switch 52 through a wiring pattern on wiring board 56. IC memory chip IC1 is connected to the terminals Dt7, Dt8, Dt9 of DIP switch 53 through a wiring pattern on wiring board 57; IC memory chip IC2 is connected to the terminals Dt10, Dt11, Dt12 of DIP switch 53 through a wiring pattern on wiring board 57.

In DIP switch 51, terminals Dt1 and Dt7 are connected to each other through a closed switch so that the signal line a1 should be connected to IC memory chip IA1; terminals Dt4 and Dt10 are connected to each other through a closed switch so that the signal line a2 should be connected to IC memory chip IA2. In DIP switch 52, terminals Dt2 and Dt8 are connected to each other through a closed switch so that the signal line b1 should be connected to IC memory chip IB1; terminals Dt5 and Dt11 are connected to each other through a closed switch so that the signal line b2 should be connected to IC memory chip IB2. In DIP switch 53, terminals Dt3 and Dt9 are connected to each other through a closed switch so that the signal line c1 should be connected to IC memory chip IC1; terminals Dt6 and Dt12 are connected to each other through a closed switch so that the signal line c2 should be connected to IC memory chip IC2. In DIP switches 51, 52, 53, switches other than those described above as being closed are made open.

The above memory module has used DIP switches. However, slide switches may be used in place of the DIP switches.

Figure 7:
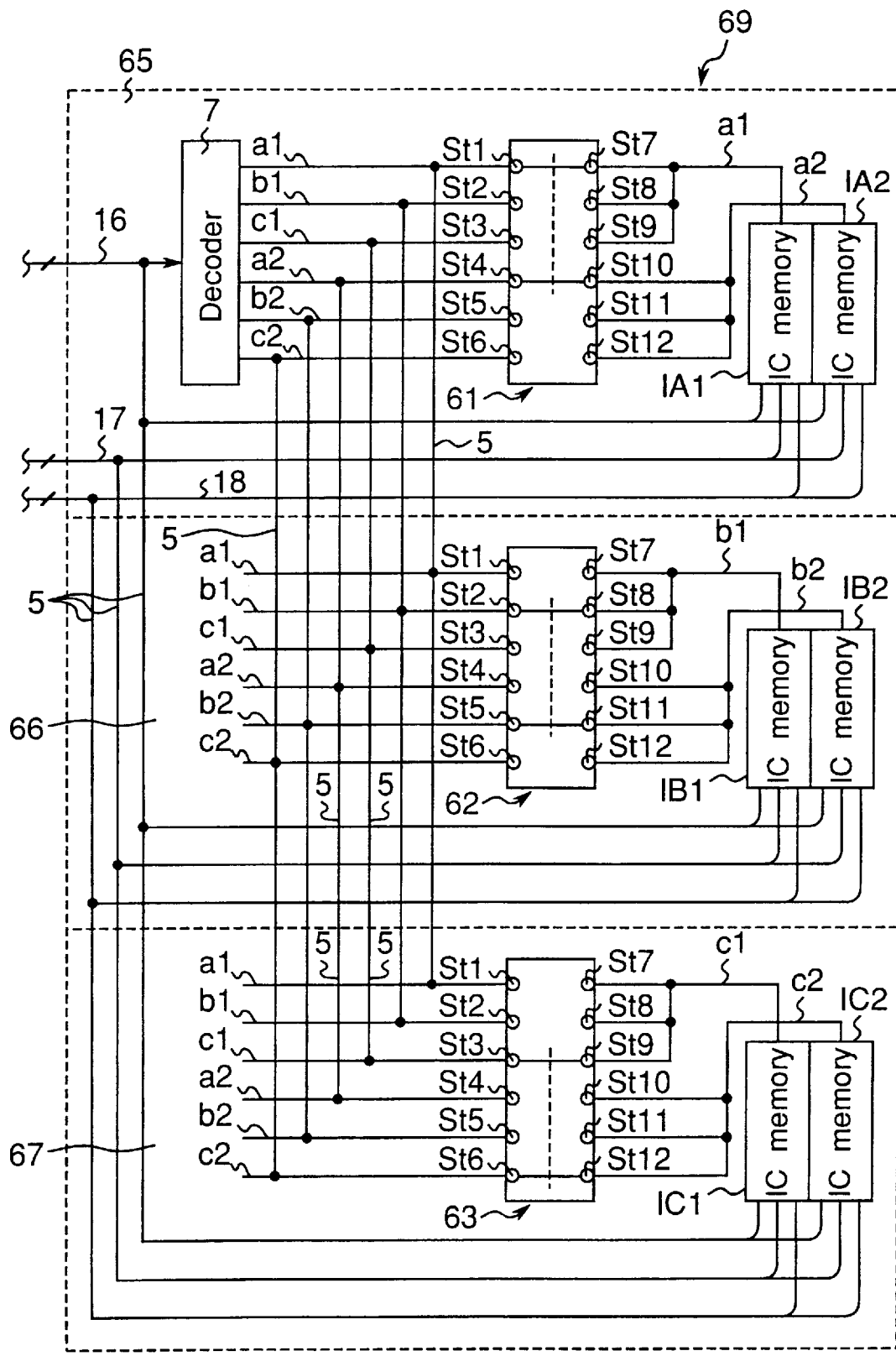
FIG. 7 is a block diagram illustrating another example of memory modules in the third embodiment of the present invention.

FIG. 7 is a block diagram illustrating another example of memory modules in the third embodiment of the present invention. In FIG. 7, the same components as in FIG. 6 are indicated with the same numerals, and their descriptions are omitted from here. Only those different from FIG. 6 are described in the following.

FIG. 7 differs from FIG. 6 as follows. Slide switches 61, 62, 63 are used in place of the DIP switches 51, 52, 53. With these changes, the wiring board 55 of FIG. 6 is changed into a wiring board 65; the wiring board 56 of FIG. 6 is changed into a wiring board 66; the wiring board 57 of FIG. 3 is changed into a wiring board 67. The memory module 59 is now changed into a memory module 69. Each of the slide switches 61, 62, 63 functions as a switching section.

Referring to FIG. 7, memory module 69 is formed of three identical wiring boards 65, 66, 67. On wiring board 65, IC memory chips IA1, IA2, decoder 7, and a slide switch 61 are mounted. On wiring board 66, IC memory chips IB1, IB2 and slide switch 62 are mounted. Similarly, on wiring board 67, IC memory chips IC1, IC2 and slide switch 63 are mounted. Decoder 7 is not mounted on wiring boards 66, 67.

Slide switches 61, 62, 63 are identical 6-pole slide switches having terminals St1, . . . , St6 and terminals St7, . . . , St12 placed opposite thereto. By sliding its control section, each of the slide switches 61, 62, 63 can connect terminal St1 to St7 and terminal St4 to St10 at the same time, or terminal St2 to St8 and terminal St5 to St11 at the same time, or terminal St3 to St9 and terminal St6 to St12 at the same time.

The signal lines a1, b1, c1, a2, b2, c2 that are connected to decoder 7 are connected to corresponding terminals St1, . . . , St6 of slide switch 61 through wiring patterns on wiring board 65. These signal lines are also connected to corresponding terminals St1, . . . , St6 of slide switch 62 through clip leads 5 and wiring patterns on wiring board 66, and also connected to corresponding terminals St1, . . . , St6 of slide switch 63 through clip leads 5 and wiring patterns on wiring board 67.

Specifically, the signal line a1 is connected to terminal St1 of slide switches 61, 62, 63. The signal line b1 is connected to terminal St2 of slide switches 61, 62, 63. The signal line c1 is connected to terminal St3 of slide switches 61, 62, 63. The signal line a2 is connected to terminal St4 of slide switches 61, 62, 63. The signal line b2 is connected to terminal St5 of slide switches 61, 62, 63. The signal line c2 is connected to terminal St6 of slide switches 61, 62, 63.

Further, terminals St7, St8, St9 of slide switch 61 are connected to each other by a wiring pattern on wiring board 65. Terminals St10, St11, St12 of slide switch 61 are connected to each other by a wiring pattern on wiring board 61. Similarly, terminals St7, St8, St9 of slide switch 62 are connected to each other by a wiring pattern on wiring board 66. Terminals St10, St11, St12 of slide switch 62 are connected to each other by a wiring pattern on wiring board 66. Terminals St7, St8, St9 of slide switch 63 are connected to each other by a wiring pattern on wiring board 67. Terminals St10, St11, St12 of slide switch 63 are connected to each other by a wiring pattern on wiring board 67.

IC memory chip IA1 is connected to the terminals St7, St8, St9 of slide switch 61 through a wiring pattern on wiring board 65; IC memory chip IA2 is connected to the terminals St10, St11, St12 of slide switch 61 through a wiring pattern on wiring board 65. Similarly, IC memory chip IB1 is connected to the terminals St7, St8, St9 of slide switch 62 through a wiring pattern on wiring board 66; IC memory chip IB2 is connected to the terminals St10, St11, St12 of slide switch 62 through a wiring pattern on wiring board 66. IC memory chip IC1 is connected to the terminals St7, St8, St9 of slide switch 63 through a wiring pattern on wiring board 67; IC memory chip IC2 is connected to the terminals St10, St11, St12 of slide switch 63 through a wiring pattern on wiring board 67.

In slide switch 61, its control section is handled so that terminals St1 and St7 should be connected to each other, and terminals St4 and St10 should be connected to each other. Therefore, the signal line a1 is connected to IC memory chip IA1; the signal line a2 is connected to IC memory chip IA2. In slide switch 62, its control section is handled so that terminals St2 and St8 should be connected to each other, and terminals St5 and St11 are connected to each other. Therefore, the signal line b1 is connected to IC memory chip IB1; the signal line b2 should is connected to IC memory chip IB2. In slide switch 63, its control section is handled so that terminals St3 and St9 are connected to each other, and terminals St6 and St12 are connected to each other. Therefore, the signal line c1 is connected to IC memory chip IC1, and the signal line c2 is connected to IC memory chip IC2.

Here, memory module 69 is constructed from three identical wiring boards 65, 66, 67 connected by clip leads 5 to form superimposed several layers. Therefore, it is difficult to handle the slide switches 62, 63 mounted on the wiring boards 66, 67 positioned at the middle and lower layer. Therefore, the shape of the control section of these slide switches can be made different from the shape of the control section of slide switch 61.

Figure 8:
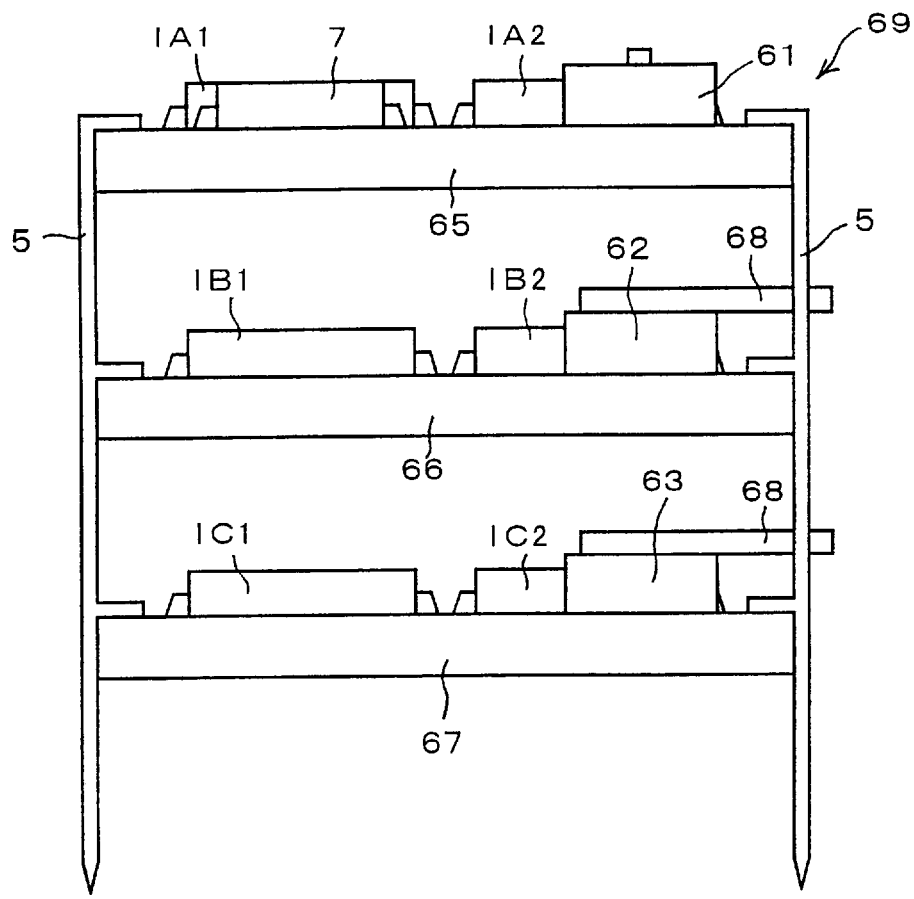
FIG. 8 is a side view of an example of the memory module 69 shown in FIG. 7.
Figure 9:
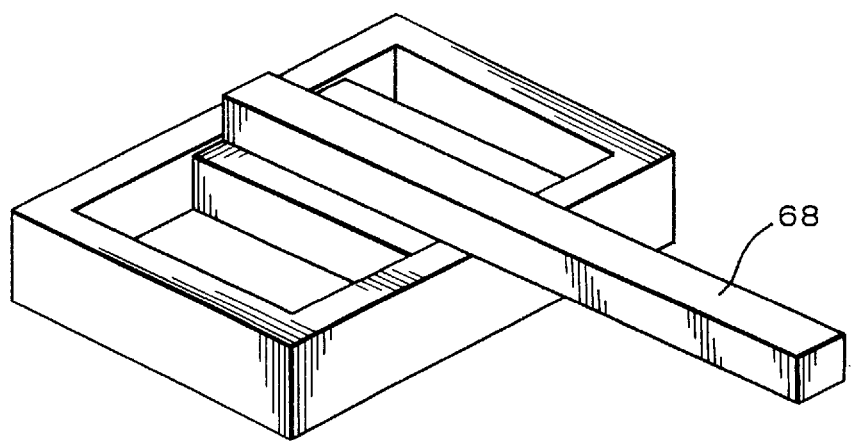
FIG. 9 is a sketch illustrating an example of the control section used for the slide switches shown in FIGS. 7 and 8.

FIG. 8 is a side view of an example of the memory module 69. FIG. 9 is a sketch illustrating an example of the control section used for the slide switches 62, 63.

Referring to FIGS. 8 and 9, a switching rod 68 stretching in the direction at a right angle with the sliding direction of the switch is formed on the control section of each slide switch 62, 63. The switching rod 68 is projecting from the side of each slide switch 62, 63 and the tip of the rod is further projecting from the peripheral of the wiring boards. By this means, the handling of the slide switches can be made easy.

The above memory modules have used DIP switches or slide switches. However, toggle switches may be used in place of the DIP switches or the slide switches.

Figure 10:
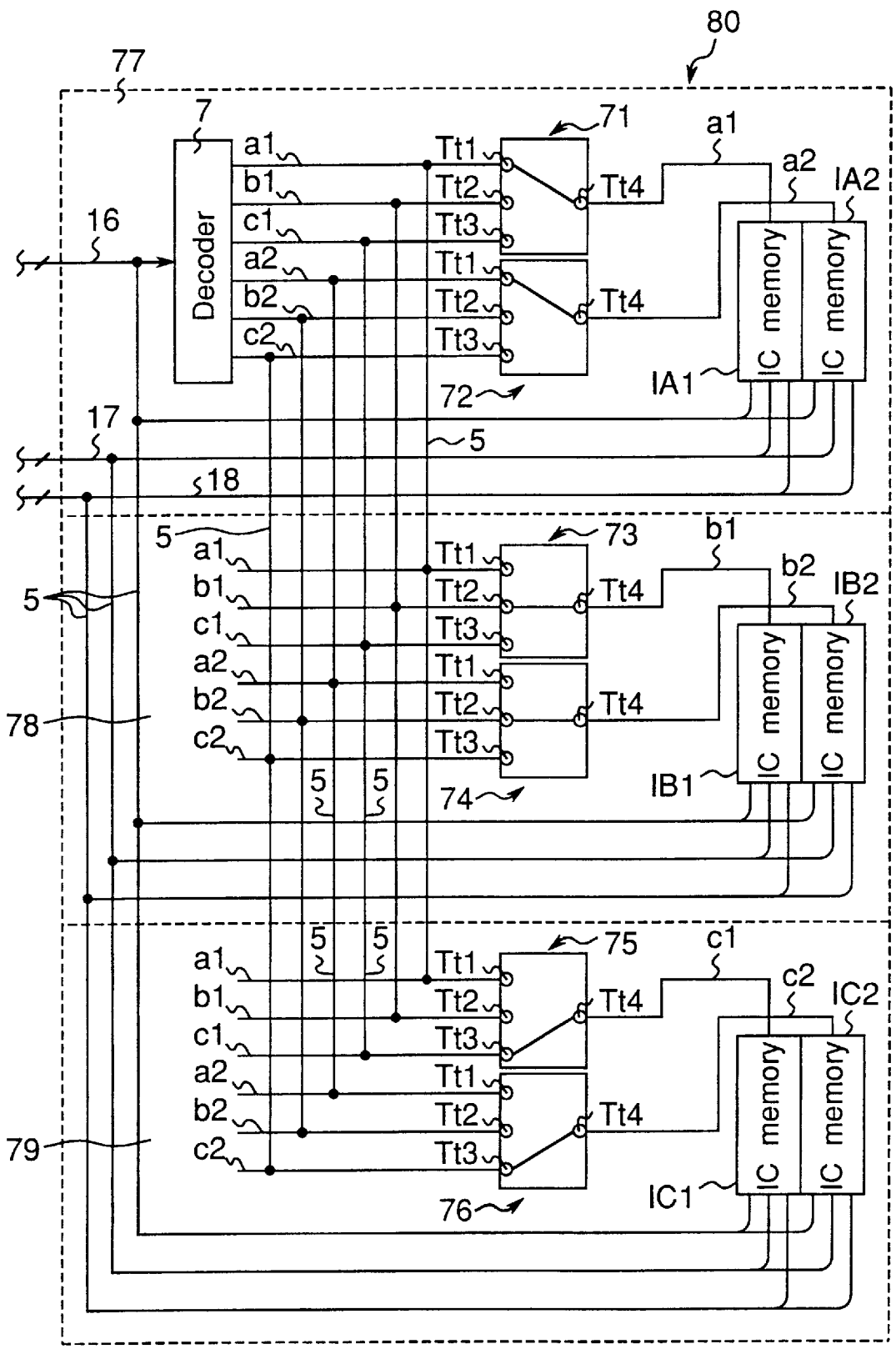
FIG. 10 is a block diagram illustrating another example of memory modules in the third embodiment of the present invention.

FIG. 10 is a block diagram illustrating another example of memory modules in the third embodiment of the present invention. In FIG. 10, the same components as in FIG. 6 are indicated with the same numerals, and their descriptions are omitted from here. Only those different from FIG. 6 are described in the following.

FIG. 10 differs from FIG. 6 as follows. Toggle switches 71, ..., 76 are used in place of the DIP switches 51, 52, 53. With these changes, the wiring board 55 of FIG. 6 is changed into a wiring board 77; the wiring board 56 of FIG. 6 is changed into a wiring board 78; the wiring board 57 of FIG. 3 is changed into a wiring board 79. The memory module 59 is now changed into a memory module 80. Toggle switches 71, ..., 76 are identical and function as switching sections.

Referring to FIG. 10, memory module 80 is formed of three identical wiring boards 77, 78, 79. On wiring board 77, IC memory chips IA1, IA2, decoder 7, and toggle switches 71, 72 are mounted. On wiring board 78, IC memory chips IB1, IB2, and toggle switches 73, 74 are mounted. Similarly, on wiring board 79, IC memory chips IC1, IC2 and toggle switches 75, 76 are mounted. Decoder 7 is not mounted on wiring boards 78, 79.

Each of the toggle switches 71, ..., 76 has terminals Tt1, ..., Tt4. The signal lines a1, b1, c1 that are connected to decoder 7 are connected to corresponding terminals Tt1, Tt2, Tt3 of toggle switch 71 through wiring patterns on wiring board 77. These signal lines are also connected to corresponding terminals Tt1, Tt2, Tt3 of toggle switch 73 through clip leads 5 and wiring patterns on wiring board 78. Similarly, these signal lines are also connected to corresponding terminals Tt1, Tt2, Tt3 of toggle switch 75 through clip leads 5 and wiring patterns on wiring board 79.

Further, the signal lines a2, b2, c2 that are connected to decoder 7 are connected to corresponding terminals Tt1, Tt2, Tt3 of toggle switch 72 through wiring patterns on wiring board 77. These signal lines are also connected to corresponding terminals Tt1, Tt2, Tt3 of toggle switch 74 through clip leads 5 and wiring patterns on wiring board 78. Similarly, these signal lines are also connected to corresponding terminals Tt1, Tt2, Tt3 of toggle switch 76 through clip leads 5 and wiring patterns on wiring board 79.

Specifically, the signal line a1 is connected to terminal Tt1 of toggle switches 71, 73, 75. The signal line b1 is connected to terminal Tt2 of toggle switches 71, 73, 75. The signal line c1 is connected to terminal Tt3 of toggle switches 71, 73, 75. The signal line a2 is connected to terminal Tt1 of toggle switches 72, 74, 76. The signal line b2 is connected to terminal Tt2 of toggle switches 72, 74, 76. The signal line c2 is connected to terminal Tt3 of toggle switches 72, 73, 74.

IC memory chip IA1 is connected to the terminal Tt4 of toggle switch 71 through a wiring pattern on wiring board 77; IC memory chip IA2 is connected to the terminal Tt4 of toggle switch 72 through a wiring pattern on wiring board 77. Similarly, IC memory chip IB1 is connected to the terminal Tt4 of toggle switch 73 through a wiring pattern on wiring board 78; IC memory chip IB2 is connected to the terminal Tt4 of toggle switch 74 through a wiring pattern on wiring board 78. IC memory chip IC1 is connected to the terminal Tt4 of toggle switch 75 through a wiring pattern on wiring board 79; IC memory chip IC2 is connected to the terminal Tt4 of toggle switch 76 through a wiring pattern on wiring board 79.

Toggle switch 71 is handled so that terminals Tt1 and Tt4 should be connected to each other to connect the signal line a1 to IC memory chip IA1; toggle switch 72 is handled so that terminals Tt1 and Tt4 should be connected to each other to connect the signal line a2 to IC memory chip IA2. Toggle switch 73 is handled so that terminals Tt2 and Tt4 should be connected to each other to connect the signal line b1 to IC memory chip IB1; toggle switch 74 is handled so that terminals Tt2 and Tt4 should be connected to each other to connect the signal line b2 to IC memory chip IB2. Toggle switch 75 is handled so that terminals Tt3 and Tt4 should be connected to each other to connect the signal line c1 to IC memory chip IC1; toggle switch 76 is handled so that terminals Tt3 and Tt4 should be connected to each other to connect the signal line c2 should be connected to IC memory chip IC2.

As described above, a memory module in the third embodiment of the present invention is constructed by connecting three wiring boards with clip leads 5 to form superimposed several layers. Then, a connection between decoder 7 and each IC memory chip of memories 6, 9, 11 can be established by switching an identical switch formed on each wiring board. Therefore, all the wiring boards can be made identical, so that developing and manufacturing costs of the wiring boards can be reduced. Further, the number of decoders can be made one. Therefore, costs of memory modules can be reduced. Further, in case of expanding memory size by adding wiring boards, wiring for connections to the decoder can be easily made.

FOURTH EMBODIMENT

In the above first to third embodiments, If the clip leads that are NC pins do not exist, lead wires with insulating films are used in place of clip leads 5. However, when leads wires with insulating films are used, the leads wires protrude from the memory module, so that the lead wires may be cut off during the manufacturing process, installing time, or the like. Therefore, through holes can be formed at the same locations of each wiring board, and the wiring boards can be electrically connected by lead wires that pass through the through holes. A memory module constructed in this way is a fourth embodiment of the present invention.

Figure 11:
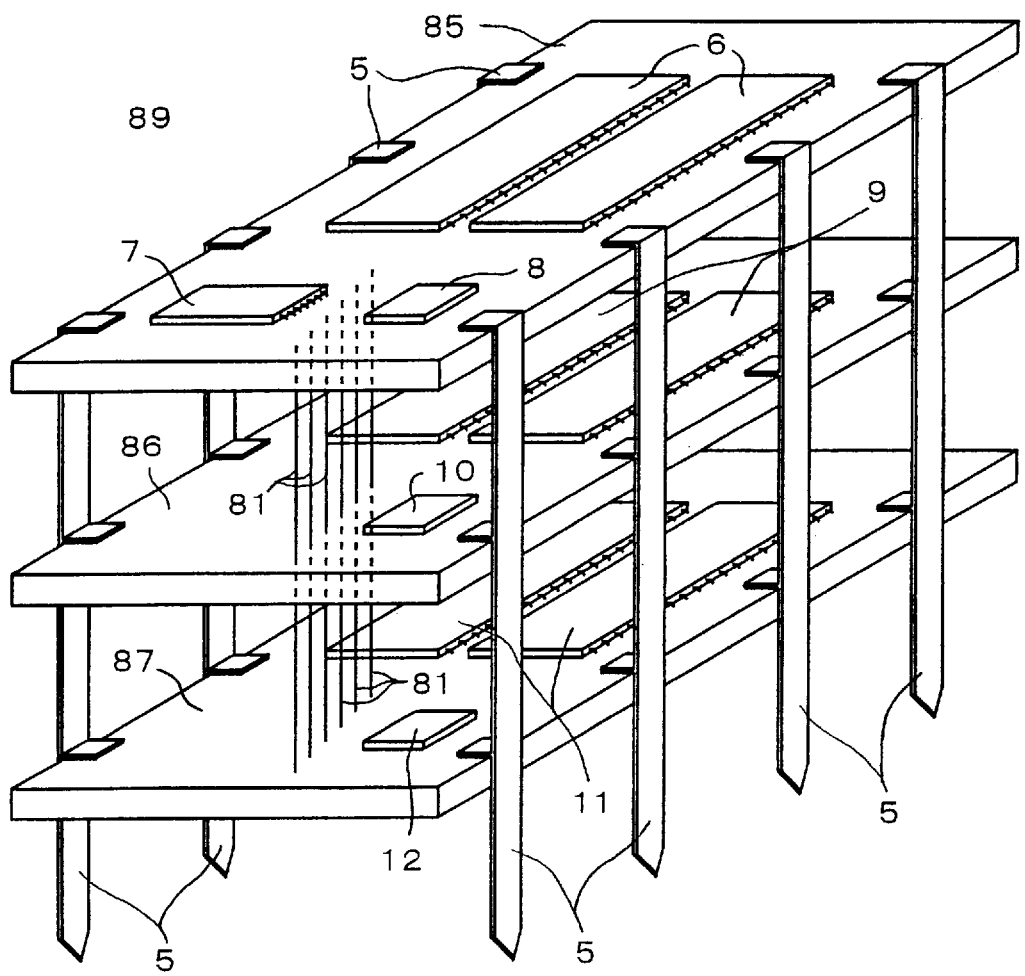
FIG. 11 is an oblique sketch illustrating an example of memory modules in a fourth embodiment of the present invention.

FIG. 11 is an oblique sketch illustrating an example of memory modules in the fourth embodiment of the present invention. In FIG. 11, the same components as in FIG. 1 are indicated with the same numerals, and their descriptions are omitted from here. Only those different from FIG. 3 are described in the following.

FIG. 11 differs from FIG. 1 as follows. In place of clip leads 5 for the connections between decoder 7 and switching sections 10, 12, a plurality of through holes are formed at the same locations of each wiring board 2, 3, 4. Then, a lead wire 81 is put through a through hole at the same location of each wiring board and is soldered to a pad at the through hole. With these changes, the wiring board 2 of FIG. 1 is changed into a wiring board 85; the wiring board 3 of FIG. 1 is changed into a wiring board 86; the wiring board 4 of FIG. 1 is changed into a wiring board 87. The memory module 1 is now changed into a memory module 89. In FIG. 11, all of the clip leads 5 and lead wires 81 are not shown, and only part of the clip leads 28 and lead wires 81 is shown.

In memory module 89, the signal lines a1, . . . , an, b1, . . . , bn, c1, . . . , cn that are connected to decoder 7 are connected to switching section 8 through wiring patterns on wiring board 85. These signals are also connected to switching section 10 through lead wires 81 and wiring patterns on wiring board 86 and connected to switching section 12 through lead wires 81 and wiring patterns on wiring board 87.

Figure 12:
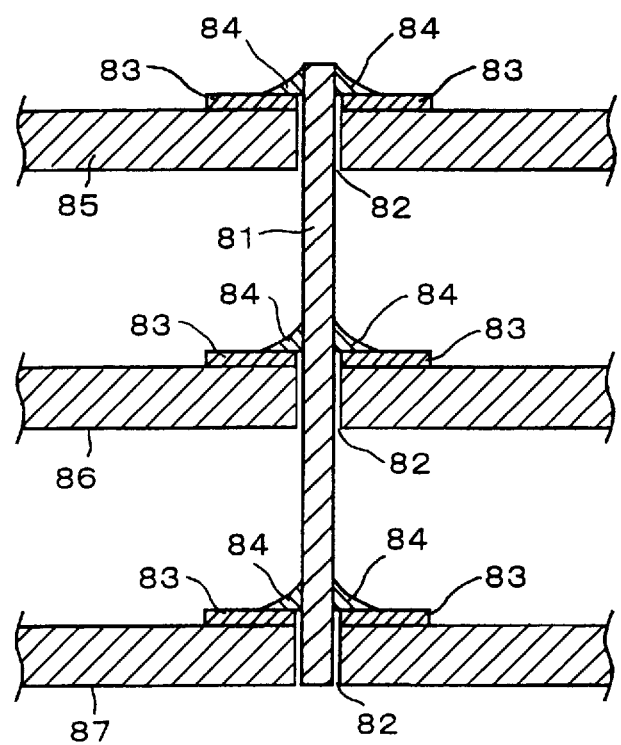
FIG. 12 is a cross section illustrating an example of connections between lead wires 81 and wiring boards 85 to 87.

FIG. 12 is a cross section illustrating the state of pads 83 formed around the through holes 82 and connected to lead wires 81 by solder 84, where the through holes 82 are formed at the corresponding locations of wiring boards 85, 86, 87. Referring to FIG. 12, pads 83 are formed around the through holes that are formed at the corresponding locations of each wiring board 85, 86, 87. Each of the pads 83 is connected to a corresponding signal line of the signal lines a1, . . . , an, b1, . . . , bn, c1, . . . , cn by a wiring pattern on each wiring board 85, 86, 87.

For example, in the case where one of the lead wires 81 illustrated in FIG. 12 is a lead wire that connects the signal line a1 to switching sections 10 and 12, the corresponding pad of the pads 83 formed on wiring board 85 is connected to a wiring pattern that forms the signal line a1 on wiring board 85. Similarly, the corresponding pad of the pads 83 formed on wiring board 86 is connected to the wiring pattern that forms the signal line a1 on wiring board 86. The corresponding pad of the pads 83 formed on wiring board 87 is connected to the wiring pattern that forms the signal line a1 on wiring board 87.

Each of the lead wires 81 inserted through through holes 82 of each wiring board 85, 86, 87 is connected by solder to the corresponding pad of the pads 83 formed on each wiring board 85, 86, 87. In this way, each of the lead wires 81 connects each wiring pattern that forms one of the signal lines a1, . . . , an, b1, . . . , bn, c1, . . . , cn on each wiring board to the same wiring pattern on each other wiring board. Here, each of lead wires 81 may as well be formed from a thin piece of metal to make each of the through holes 82 as small as small.

As described above, a memory module in the fourth embodiment of the present invention establishes the connections between decoder 7 and switching sections 8, 12 by using, in place of clip leads 5 of the memory module in the first to third embodiments, a plurality of through holes 82 formed at the same locations of each wiring board and lead wires 81 passed through the corresponding through holes 82. Each of the lead wires 81 is connected by solder to the pad of the pads 83 formed around the corresponding hole of the through holes 82 formed in each of the wiring boards. Therefore, in addition to the advantages of the first to third embodiments, the breaking of lead wires that may occur during the manufacturing process, installation time, or the like can be prevented, even if the clip leads that are NC pins do not exist.

FIFTH EMBODIMENT

The clip leads that are used in the above first to fourth embodiments can be replaced with sockets. A memory module constructed in this way is a fifth embodiment of the present invention. The following description of the fifth embodiment is given in the case where DIP switches in the third embodiment are used. Modifications to the other embodiments are similar and omitted from here.

Figure 13:
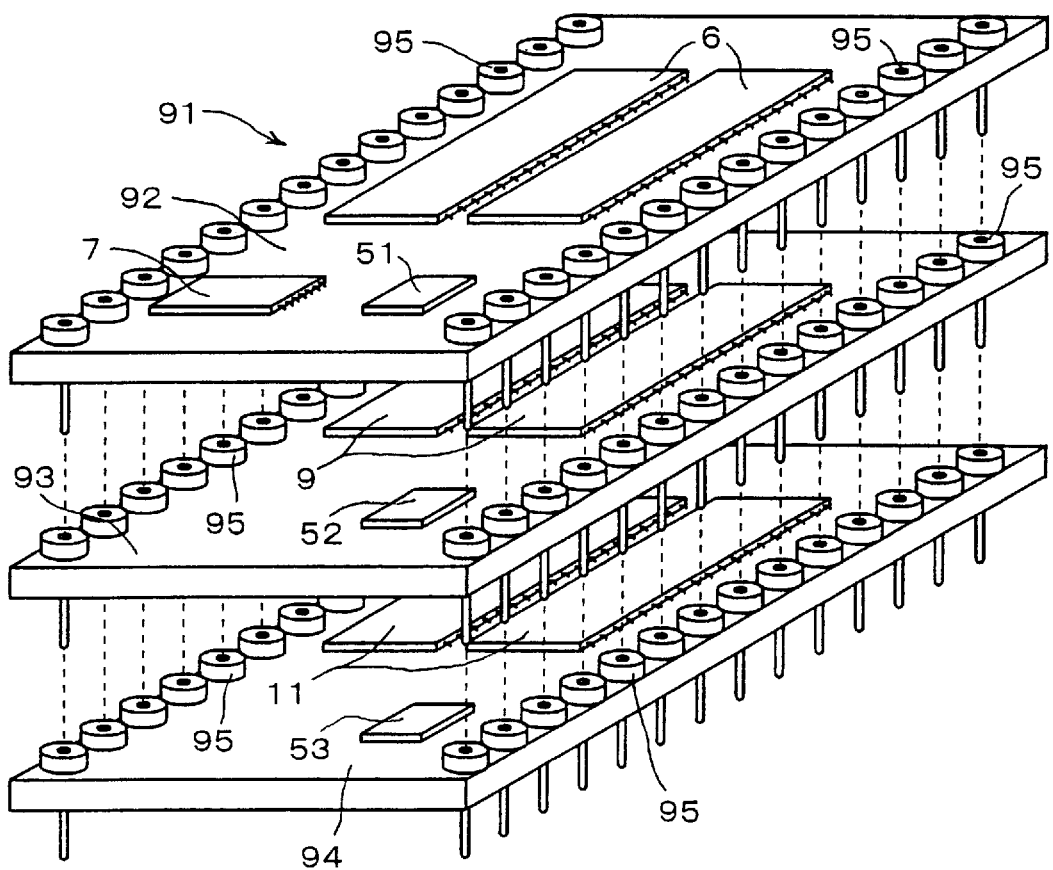
FIG. 13 is an oblique sketch illustrating an example of the connections of wiring boards through sockets for memory modules in a fifth embodiment of the present invention.
Figure 14:
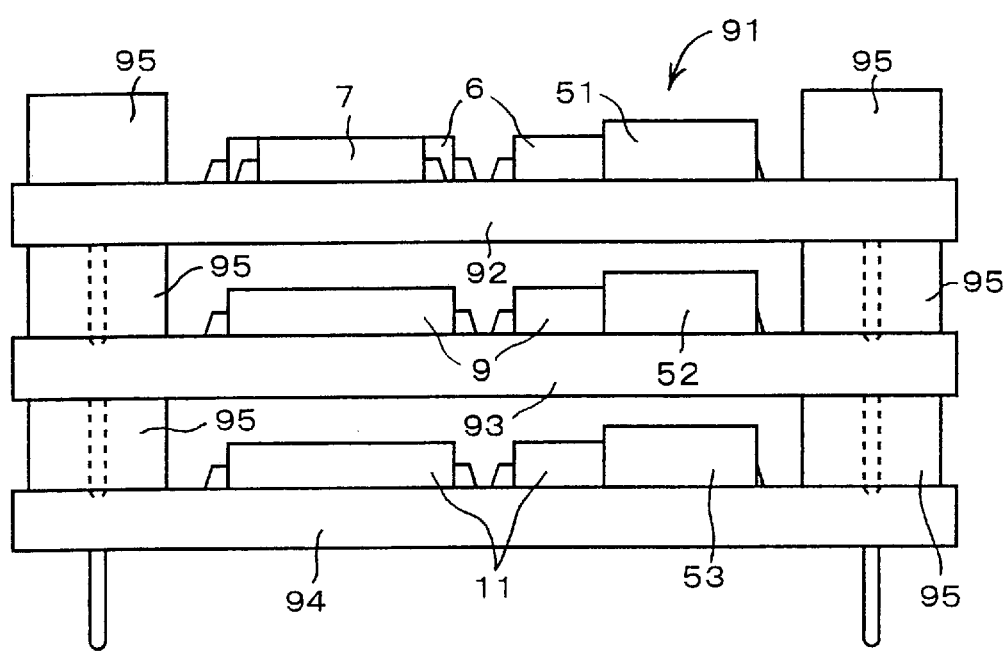
FIG. 14 is a side view illustrating the example of the connections of wiring boards through sockets shown in FIG. 13.
Figure 15:
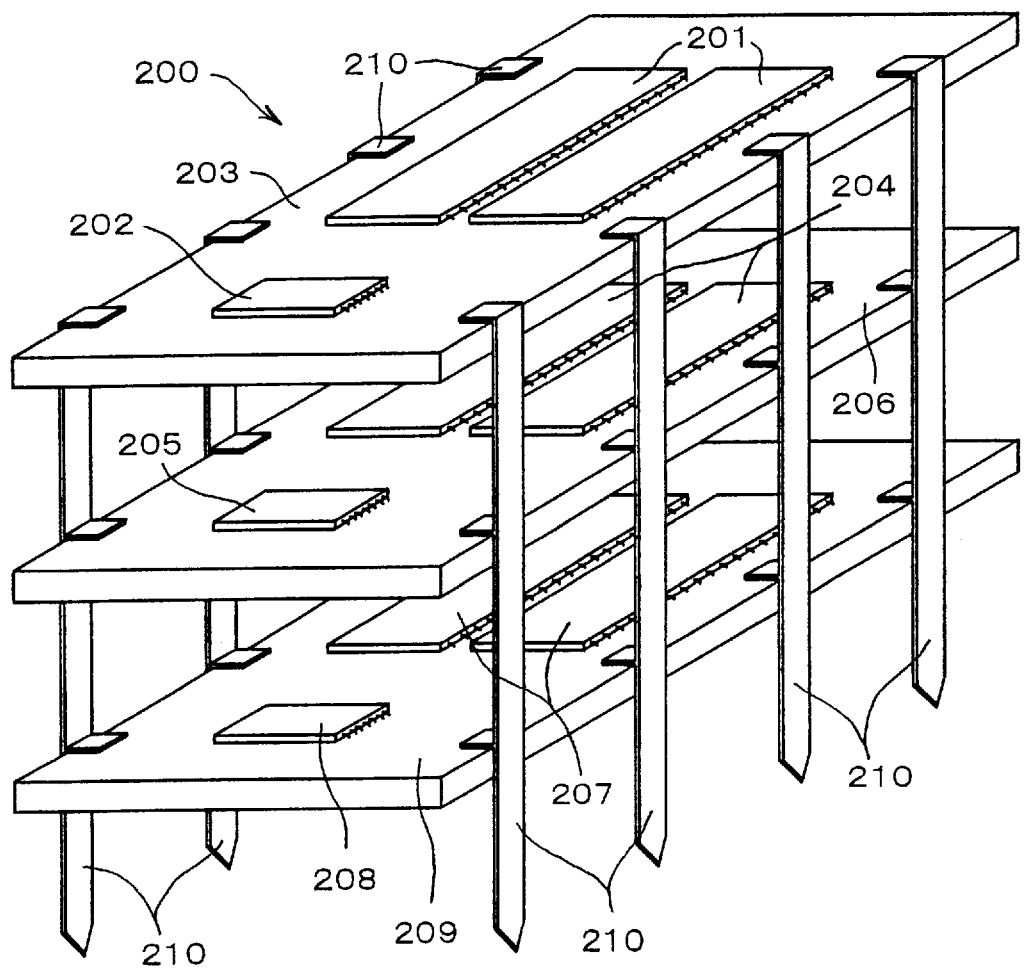
FIG. 15 is an oblique sketch illustrating an example of prior memory modules.
Figure 16:
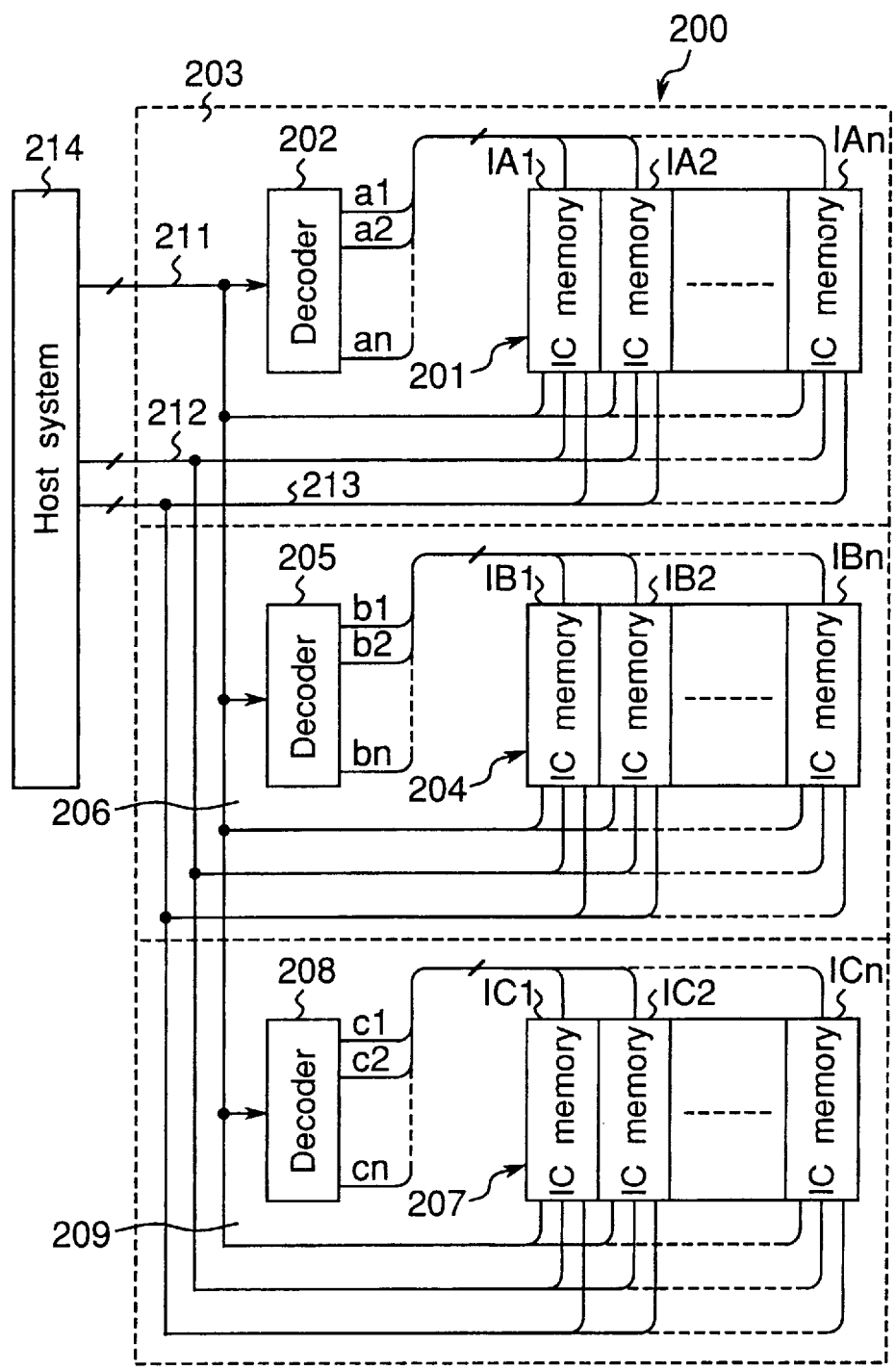
FIG. 16 is a block diagram illustrating an example of connections between the memories and decoders sown in FIG. 15.

FIG. 13 is an oblique sketch illustrating an example of the connections of wiring boards through sockets for memory modules in the fifth embodiment of the present invention. FIG. 14 is a side view illustrating the example of the connections of wiring boards through sockets shown in FIG. 13. In FIGS. 13 and 14, the same components as in the first and third embodiments are indicated by the same numerals, and their descriptions are omitted from here.

Referring to FIGS. 13 and 14, a memory module 91 is constructed from three identical wiring boards 92, 93, 94 connected together by a plurality of sockets 95 to form superimposed several layers. Memory 6, decoder 7, and DIP switch 51 are mounted on wiring board 92. Memory 9 and DIP switch 52 are mounted on wiring board 93. Similarly, memory 11 and DIP switch 53 are mounted on wiring board 94. Further, a plurality of sockets 95 are formed at the same locations of each edge of each wiring board 92, 93, 94. The sockets formed at the same lection of each wiring board 92, 93,94 are connected together, so that the wiring boards 92, 93, 94 are connected. In FIG. 13, not all of the sockets 95 are illustrated. Only part of the sockets 95 is illustrated.

In the following is described a memory module 91 where memory 6 comprises IC memory chips IA1 and IA2, memory 9 comprises IC memory chips IB1 and IB2, and memory 11 comprises IC memory chips IC1 and IC2.

The signal lines a1, b1, c1, a2, b2, c2 that are connected to decoder 7 are connected to corresponding terminals Dt1, . . . , Dt6 of DIP switch 51 through wiring patterns on wiring board 92. These signal lines are also connected to corresponding terminals Dt1, . . . , Dt6 of DIP switch 52 through sockets 95 and wiring patterns on wiring board 93, and also connected to corresponding terminals Dt1, . . . , Dt6 of DIP switch 53 through sockets 95 and wiring patterns on wiring board 94. Here, sockets 95 function as connecting members.

As described above, a memory module in the fifth embodiment of the present invention uses sockets 95 in place of clip leads of the memory modules in the first to fourth embodiments, so that the connections between the wiring boards can be easily made. Therefore, in addition to the advantages of the first to fourth embodiments, wiring boards can be easily added, so that the expansion of memory size is easily made.

In the above descriptions of the first to fifth embodiments, a memory module is constructed from three wiring boards. However, that construction is an example. The present invention does not limit the number of wiring boards that form a memory module.

ADVANTAGES OF THE INVENTION

According to the first aspect of the present invention, a memory module of the present invention is constructed by connecting a plurality of identical wiring boards with connecting members. A decoder is mounted on one of the wiring boards. Each switching section mounted on each wiring board switches the connections between wiring patterns that are connected to the decoder and wiring patterns that are connected to IC memory chips in order to allow the control signals output from the decoder to be input to the corresponding IC memory chips. Therefore, the number of decoders can be made one, and all the wiring boards can be made identical. Consequently, developing and manufacturing costs can be reduced, so that costs for memory modules can be reduced.

According to the second aspect of the present invention, in the first aspect of the present invention, each of the switching sections is formed of pads formed on each wiring board and lead wires that establish connections between predetermined pads. Connections between the decoder and the IC memory chips mounted on each wiring board are established by changing the connections due to the lead wires of each switching section. Therefore, the number of decoders can be made one, and all the wiring boards can be made identical. Consequently, developing and manufacturing costs can be reduced, so that costs for memory modules can be reduced.

According to a third aspect of the present invention, in the first aspect, each of the switching sections comprises pads that are formed on each of the wiring boards and chip jumpers that connect predetermined ones of the pads together. Connections between the decoder and the IC memory chips mounted on each wiring board are established by changing the connections due to the chip jumpers of each switching section. Therefore, the number of decoders can be made one, and all the wiring boards can be made identical. Consequently, developing and manufacturing costs can be reduced. Further, connections between pads at each switching section can be automatically made with a machine, so that wiring on each wiring board can be efficiently made, and manufacturing costs can be reduced. Further, the area of each switching section can be made small, so that each wiring board can be made small. By these means costs for memory modules can be reduced.

According to a fourth aspect of the present invention, in the first aspect, each of the switching sections is a switch mounted on each of the wiring boards. Connections between the decoder and the IC memory chips mounted on each wiring board are established by switching the switch. Therefore, the number of decoders can be made one, and all the wiring boards can be made identical. Consequently, developing and manufacturing costs can be reduced. Further, in case of expanding memory size by adding wiring boards, wiring for connections to the decoder can be easily made.

According to a fifth aspect of the present invention, in the first to fourth aspects, the above connecting members consist in a plurality of clip leads that also establish connections between the decoder and the switching sections on the wiring boards on which the decoder is not mounted. Therefore, similar effects as of the above first to fourth aspects can be obtained.

According to the sixth aspect of the present invention, in the first to fourth aspects, the connecting members consist in a plurality of sockets that superimpose the wiring boards to form several layers and connect the wiring boards together, by connecting the sockets installed on the same locations of each of the wiring boards. The sockets also establish connections between the decoder and the switching sections on the wiring boards on which the decoder is not mounted. Therefore, in addition to the effects of the above first to fourth aspects, connections between the wiring boards can be easily made. Therefore, wiring boards can be easily added, so that memory size can be easily expanded.

According to the seventh aspect of the present invention, in the first to fourth aspects, the memory module has through holes formed in the same locations of each of the wiring boards, pads formed around the through holes to be connected to predetermined wiring patterns, and lead wires passed through the through holes formed in identical locations of the siring boards and electrically connected to the corresponding pads to establish connections between the decoder and the switching sections on the wiring boards on which the decoder is not mounted. Therefore, in addition to the effects of the first to fourth aspects, the breaking of lead wires that may occur during the manufacturing process, installation time, or the like can be prevented.

Although the present invention has been fully described in connection with the preferred embodiments thereof and the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A memory module comprising:
 a plurality of identical wiring boards each having a wiring pattern formed thereon and at least one IC memory chip mounted thereon;

board connection means which supports said plurality of wiring boards in a multi-stage fashion and electrically connects respective wiring boards;

one decoder mounted on one of said plurality of wiring boards which decoded address signals externally input and outputs control signals;

each of said wiring patterns comprising a first wiring pattern being connected to the output of said decoder and a second wiring pattern being connected to said at least one IC chip mounted on said each wiring board; and inter-pattern connection means arranged on each wiring board for selectively connecting said first wiring pattern and said second wiring pattern.

2. The memory module defined in claim 1 in which each of said inter-pattern connection means comprises pads that are formed on each of said wiring boards and lead wires that connect predetermined ones of said pads together, said pads being formed on the first and second wiring patterns connected to said decoder and to said IC memory chips.

3. The memory module defined in claim 1 in which each of said inter-pattern connection means comprises pads that are formed on each of said wiring boards and chip jumpers that connect predetermined ones of said pads together, said pads being formed on said first and second wiring patterns connected to said decoder and said IC memory chips.

4. The memory module defined in claim 1 in which each of said inter-pattern connection means is a switch mounted on each of said wiring boards and establishes connections between said first and second wiring patterns connected to said decoder and to said IC memory chips to allow a control signal output from said decoder to be input to a corresponding one of said IC memory chips.

5. The memory module defined in claim 1 in which said board connection means consists of a plurality of clip leads that also establish connections between said decoder and each of said inter-pattern connection means on said wiring boards on which said decoder is not mounted.

6. The memory module defined in claim 1 in which said board connection means consists of a plurality of sockets that stack said wiring boards in a multi-stage fashion and connects said wiring boards together, by connecting said sockets installed on the same locations of each of said wiring boards, said sockets also establishing connections between said decoder and said first wiring pattern on each of said wiring boards on which said decoder is not mounted.

7. The memory module defined in claim 1 in which said memory module has through holes formed in the same locations of each of said wiring boards, pads identically formed around said through holes to be connected to predetermined ones of said wiring patterns, and lead wires passed through said through holes formed in identical locations of said wiring boards and electrically connected to the corresponding ones of said pads to establish connections between said decoder and said first wiring pattern on each of said wiring boards on which said decoder is not mounted.

* * * * *